(12) United States Patent
Sohda et al.

(10) Patent No.: US 11,435,178 B2
(45) Date of Patent: Sep. 6, 2022

(54) CALIBRATION SAMPLE, ELECTRON BEAM ADJUSTMENT METHOD AND ELECTRON BEAM APPARATUS USING SAME

(71) Applicant: HITACHI HIGH-TECH CORPORATION, Tokyo (JP)

(72) Inventors: Yasunari Sohda, Tokyo (JP); Yoshinori Nakayama, Tokyo (JP); Kaori Bizen, Tokyo (JP); Hiroya Ohta, Tokyo (JP); Yusuke Abe, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 297 days.

(21) Appl. No.: 16/638,634

(22) PCT Filed: Aug. 25, 2017

(86) PCT No.: PCT/JP2017/030563
§ 371 (c)(1),
(2) Date: Feb. 12, 2020

(87) PCT Pub. No.: WO2019/038917
PCT Pub. Date: Feb. 28, 2019

(65) Prior Publication Data
US 2021/0131801 A1 May 6, 2021

(51) Int. Cl.
*G01B 15/00* (2006.01)
*H01J 37/10* (2006.01)
(Continued)

(52) U.S. Cl.
CPC .............. *G01B 15/00* (2013.01); *H01J 37/10* (2013.01); *H01J 37/1474* (2013.01);
(Continued)

(58) Field of Classification Search
CPC ....... G01B 15/00; G01B 21/042; H01J 37/10; H01J 37/1474; H01J 37/1478; H01J 37/20;
(Continued)

(56) References Cited

U.S. PATENT DOCUMENTS

| | | | | |
|---|---|---|---|---|
| 4,668,865 | A * | 5/1987 | Gimzewski | H01J 37/20 850/10 |
| 6,881,967 | B1 * | 4/2005 | Ray | B32B 3/02 414/935 |

(Continued)

FOREIGN PATENT DOCUMENTS

| | | |
|---|---|---|
| JP | H06224108 A | 8/1994 |
| JP | 2005183369 A | 7/2005 |

(Continued)

OTHER PUBLICATIONS

Sato, et al., "Anisotropic etching rates of single-crystal silicon for TMAH water solution as a function of crystallographic orientation", Sensors and Actuators 73 (1999) 131-137.
(Continued)

*Primary Examiner* — David A Vanore
(74) *Attorney, Agent, or Firm* — Miles & Stockbridge P.C.

(57) ABSTRACT

To implement a calibration sample by which an incident angle can be measured with high accuracy, an electron beam adjustment method, and an electron beam apparatus using the calibration sample. To adjust an electron beam using a calibration sample, the calibration sample includes a silicon single crystal substrate 201 whose upper surface is a {110} plane, a first recess structure 202 opening in the upper surface and extending in a first direction, and a second recess structure 203 opening in the upper surface and extending in a second direction intersecting the first direction, in which the first recess structure and the second recess structure each (Continued)

include a first side surface and a first bottom surface that intersects the first side surface, and a second side surface and a second bottom surface that intersects the second side surface, the first side surface and the second side surface are {111} planes, and the first bottom surface and the second bottom surface are crystal planes different from the {110} planes.

15 Claims, 17 Drawing Sheets

(51) Int. Cl.
    *H01J 37/147* (2006.01)
    *H01J 37/20* (2006.01)
    *H01J 37/244* (2006.01)
    *H01J 37/28* (2006.01)

(52) U.S. Cl.
    CPC .......... *H01J 37/1478* (2013.01); *H01J 37/20* (2013.01); *H01J 37/244* (2013.01); *H01J 37/28* (2013.01); *H01J 2237/1501* (2013.01); *H01J 2237/2448* (2013.01)

(58) Field of Classification Search
    CPC .. H01J 37/244; H01J 37/28; H01J 2237/1501; H01J 2237/2448; H01J 2237/281; H01J 2237/2814; H01J 2237/2826; H01J 37/04
    See application file for complete search history.

(56) References Cited

U.S. PATENT DOCUMENTS

| | | | |
|---|---|---|---|
| 8,039,813 B2* | 10/2011 | Casares | H01J 37/3177 |
| | | | 250/306 |
| 8,222,119 B2* | 7/2012 | Henley | H01L 22/26 |
| | | | 156/345.55 |
| 9,679,743 B2* | 6/2017 | Fujii | H01J 37/285 |
| 2005/0133718 A1* | 6/2005 | Miyamoto | G01N 23/2251 |
| | | | 250/307 |
| 2008/0038908 A1* | 2/2008 | Henley | H01J 37/20 |
| | | | 414/935 |
| 2008/0128641 A1* | 6/2008 | Henley | H01L 21/26506 |
| | | | 315/505 |
| 2011/0133080 A1* | 6/2011 | Shishido | H01J 37/263 |
| | | | 250/307 |
| 2012/0286160 A1* | 11/2012 | Ohashi | H01J 37/28 |
| | | | 250/310 |
| 2021/0131801 A1* | 5/2021 | Soh | G01B 15/00 |

FOREIGN PATENT DOCUMENTS

| | | |
|---|---|---|
| JP | 2007187538 A | 7/2007 |
| JP | 2012234754 A | 11/2012 |

OTHER PUBLICATIONS

International Search Report w/Translation dated Oct. 24, 2017 submitted in PCT/JP2017/030563 filed Aug. 25, 2017.

* cited by examiner

[FIG. 1]
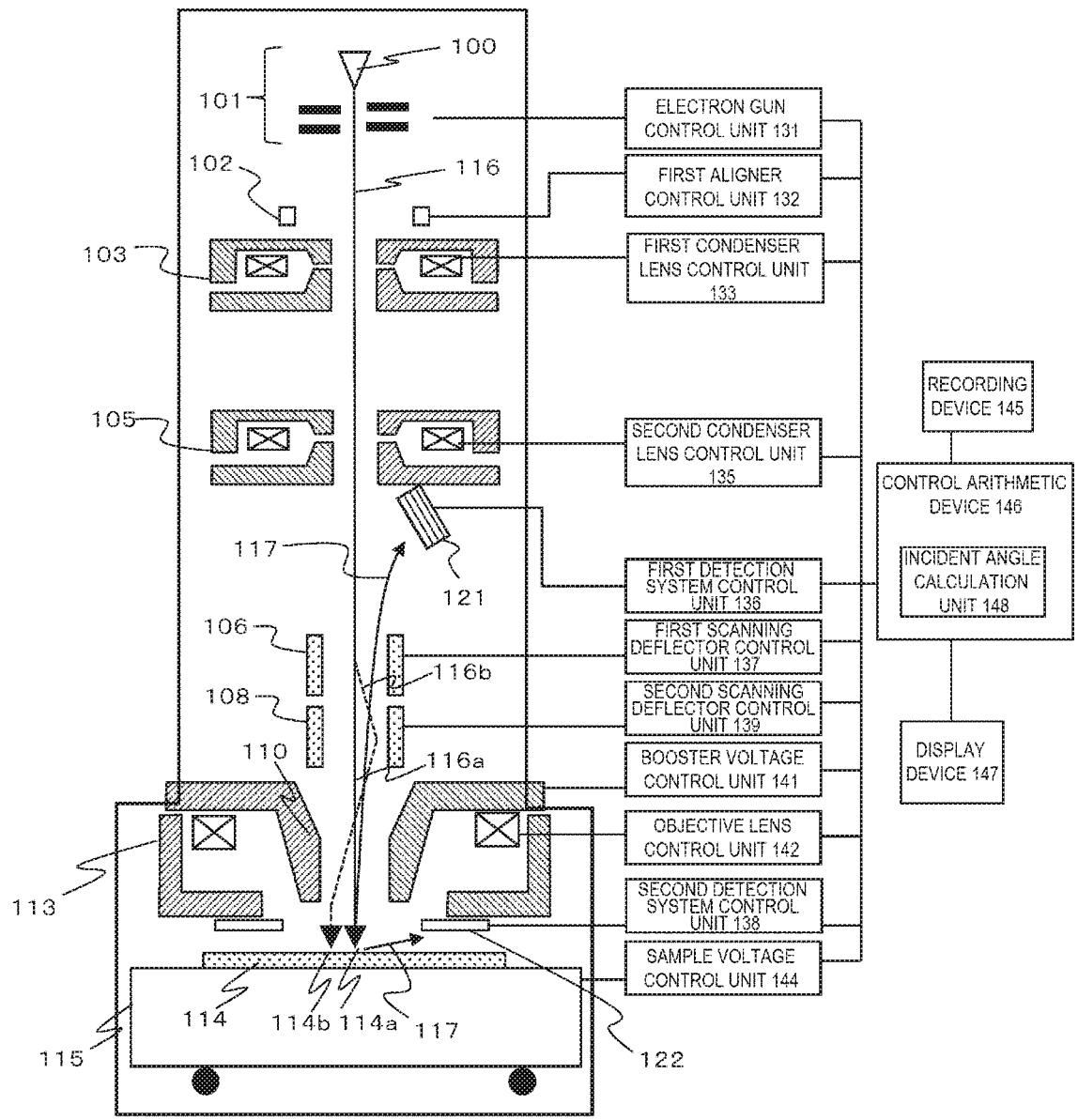

[FIG. 2]
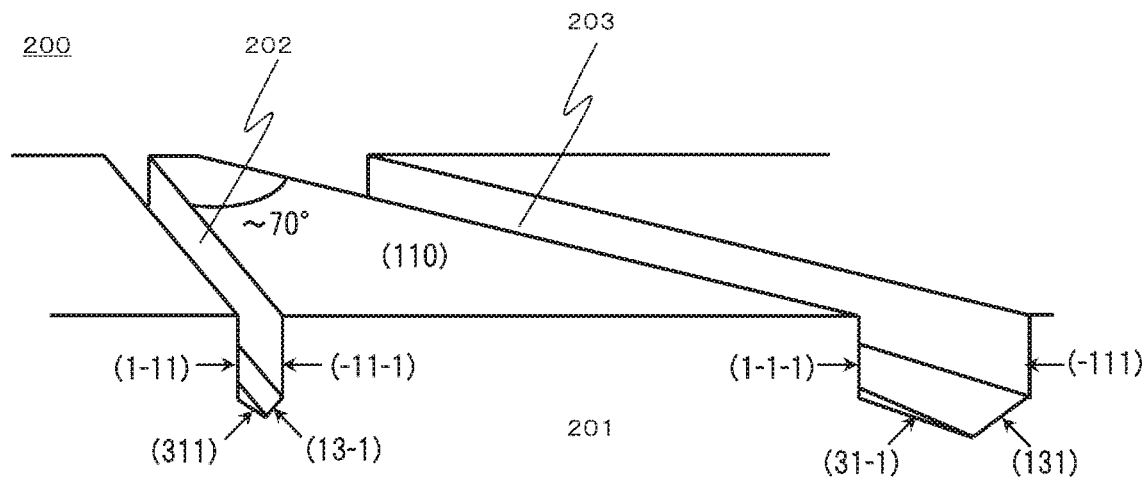
[FIG. 3]
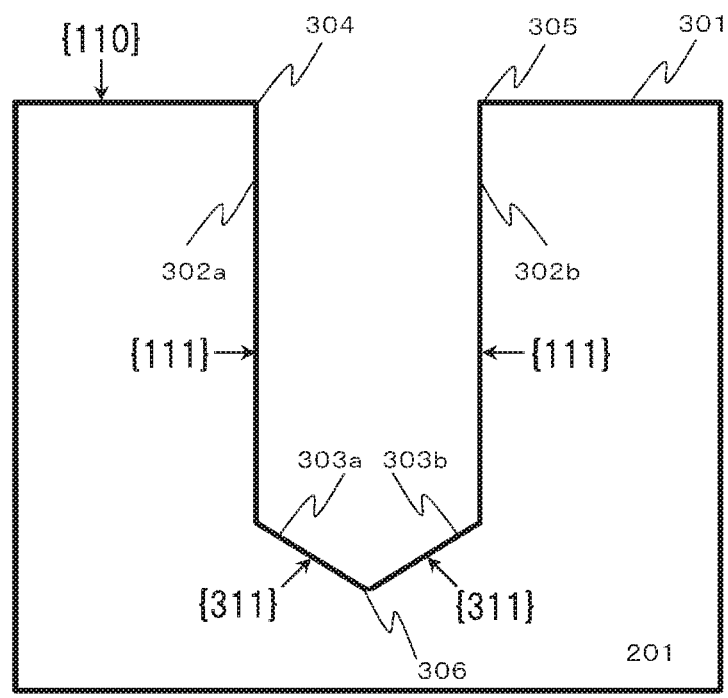

[FIG. 4]
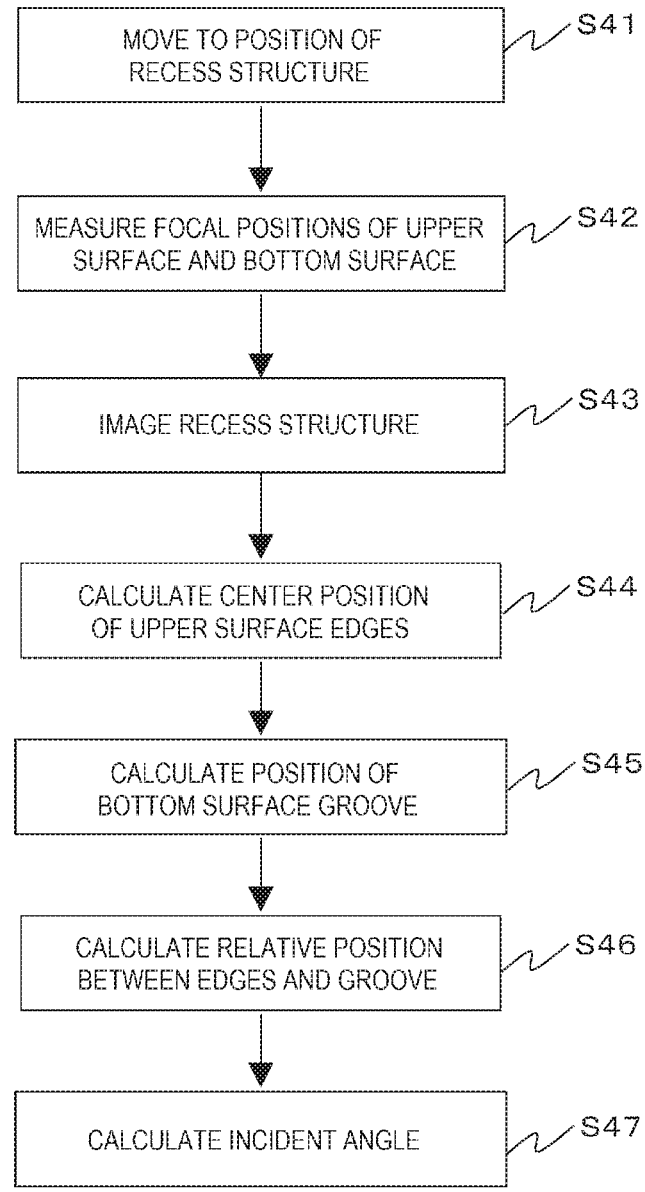

[FIG. 5]
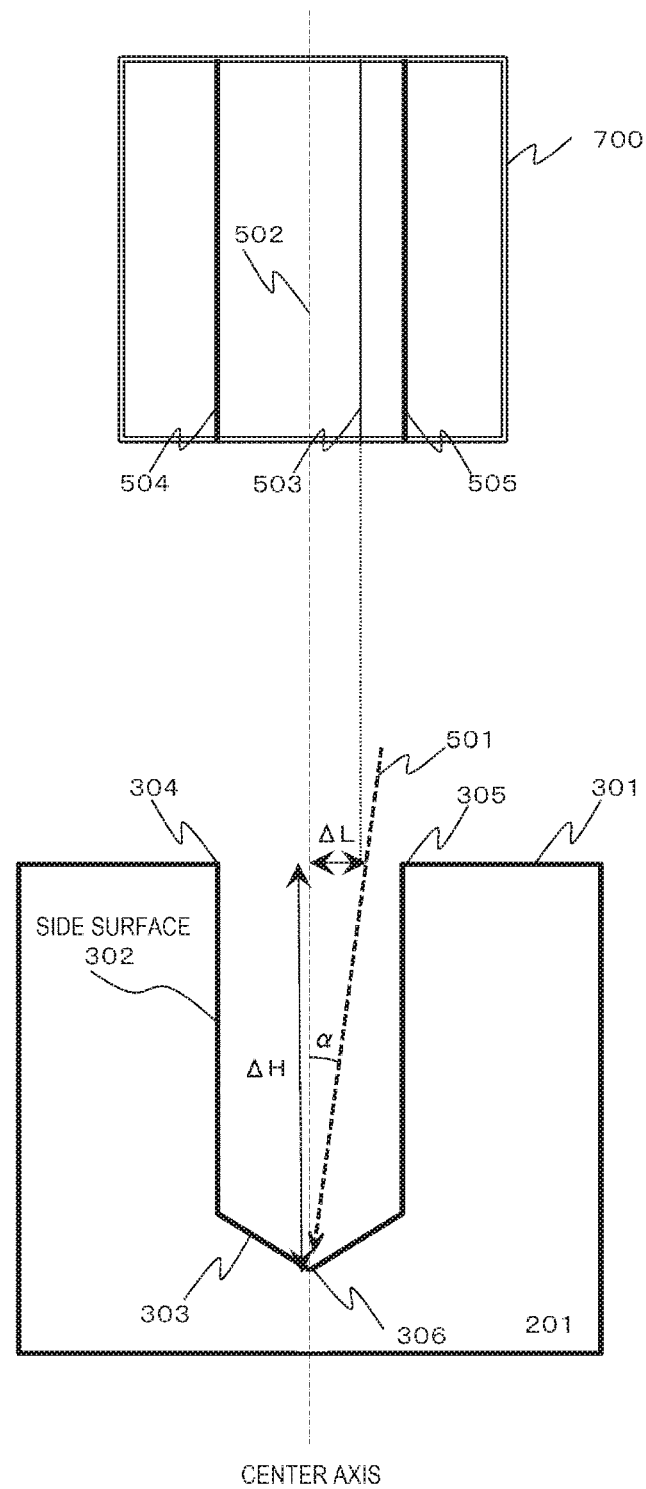

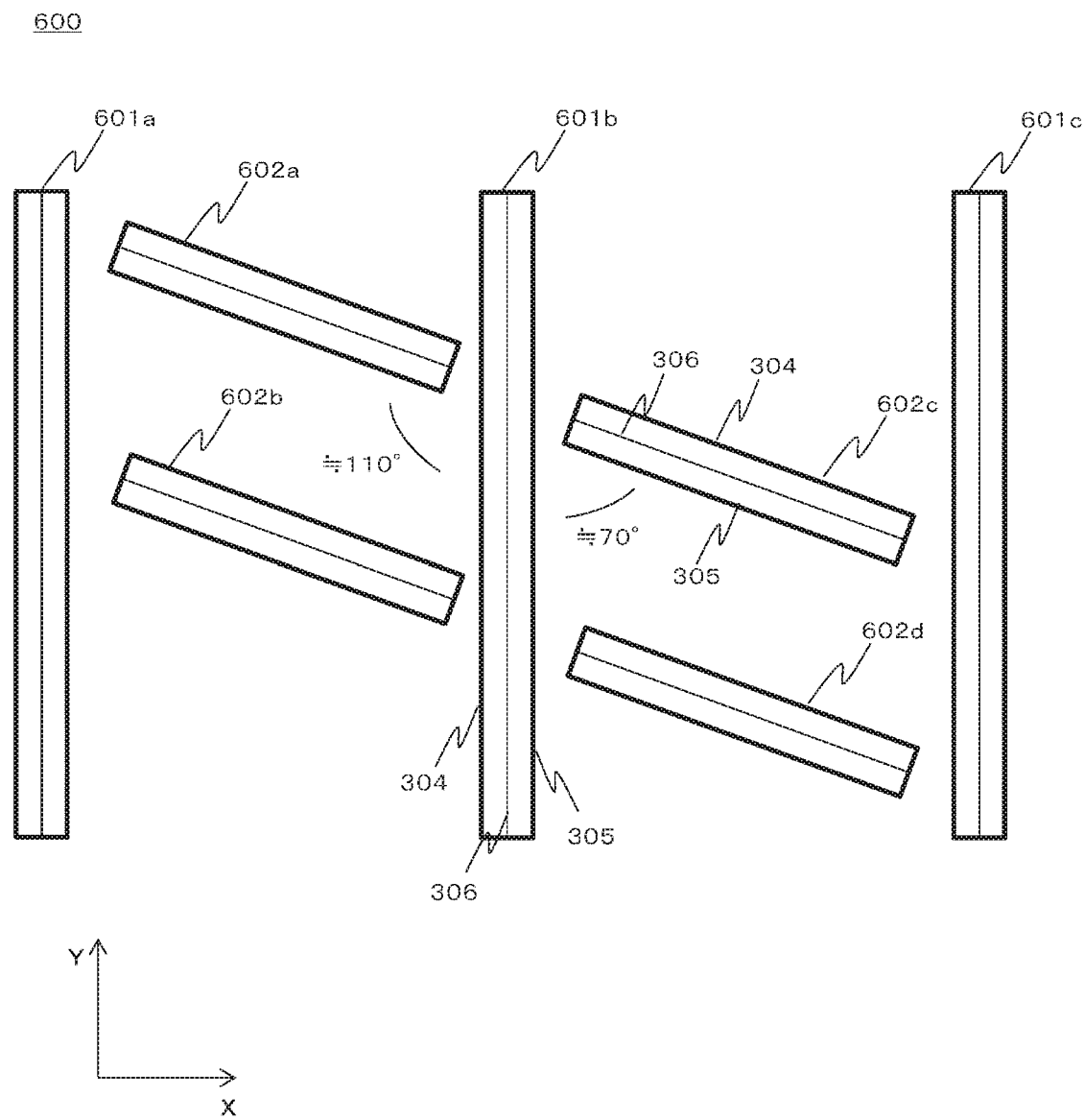
[FIG. 6]

[FIG. 7A]
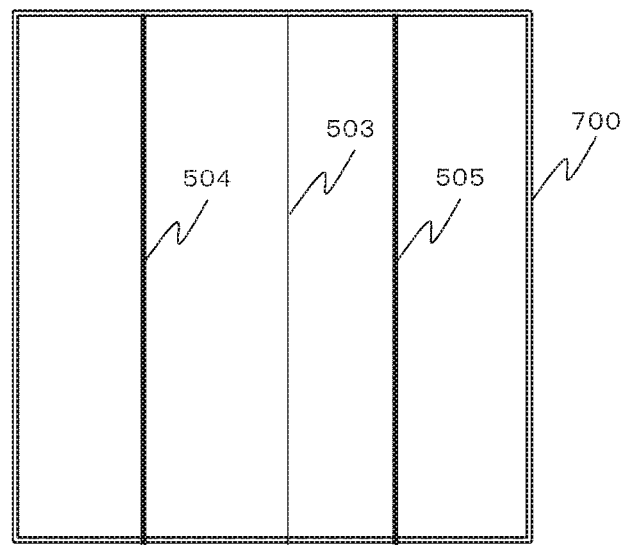
[FIG. 7B]
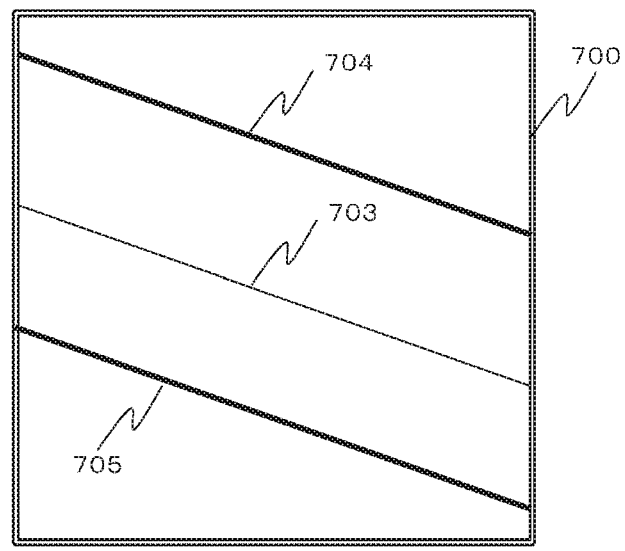

[FIG. 8]
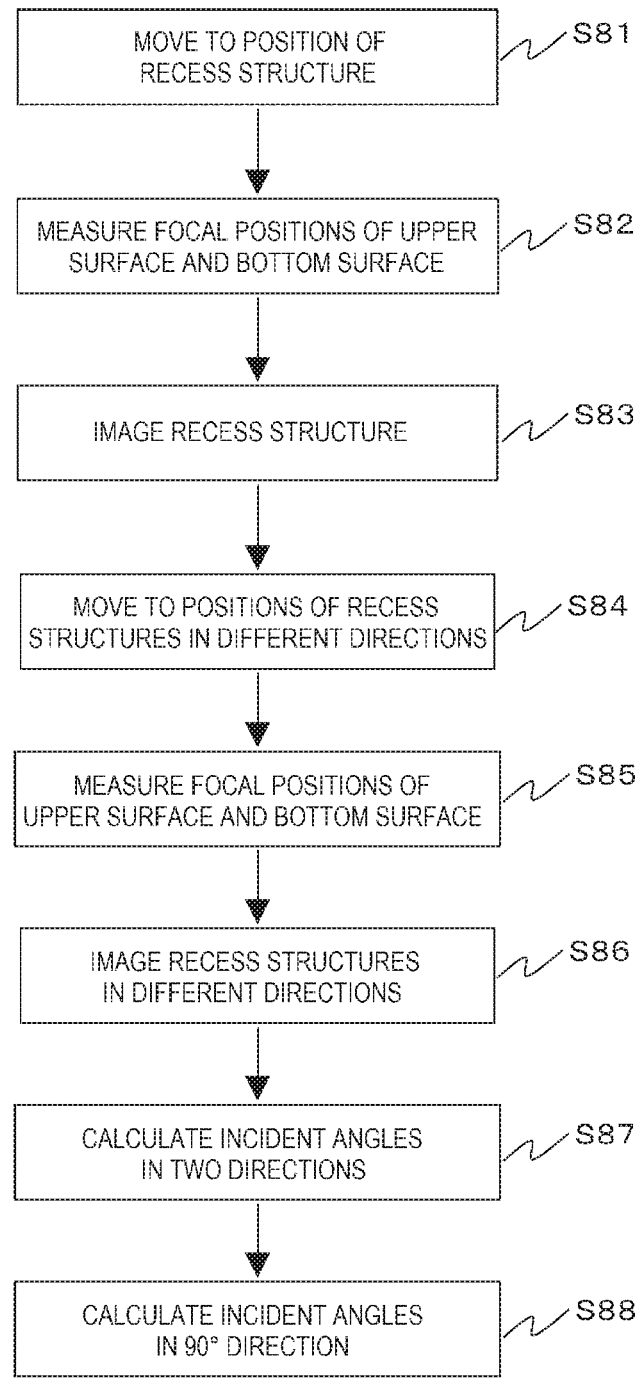

[FIG. 9]
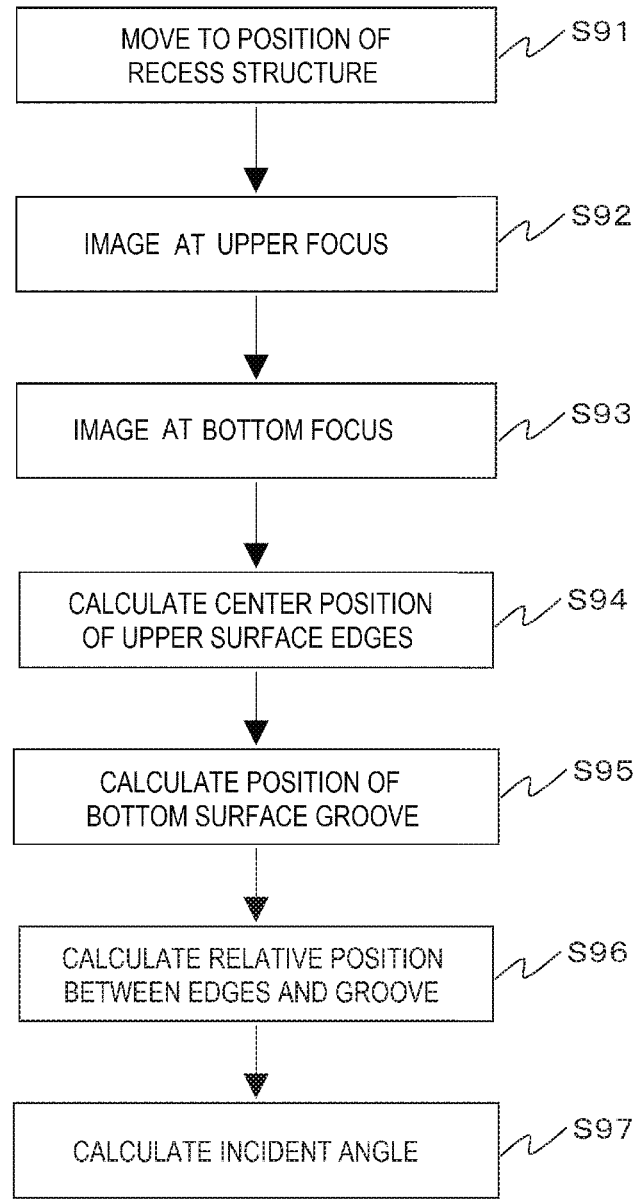

[FIG. 10A]
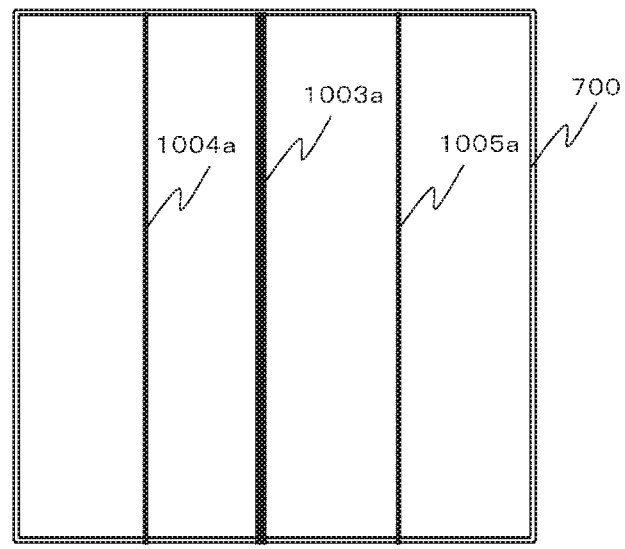
[FIG. 10B]
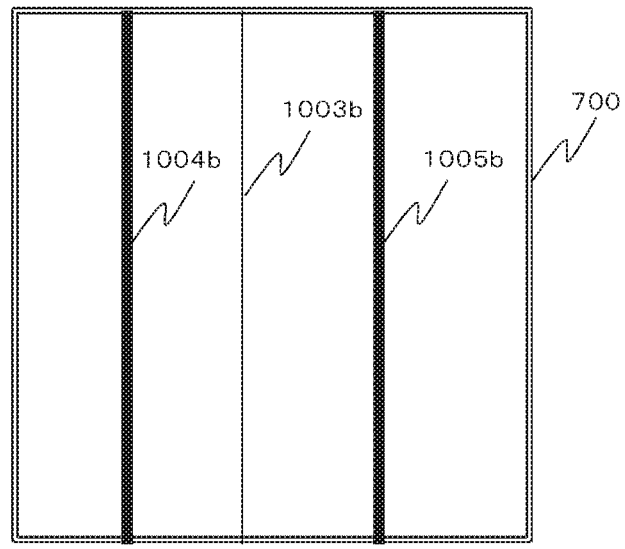

[FIG. 11]
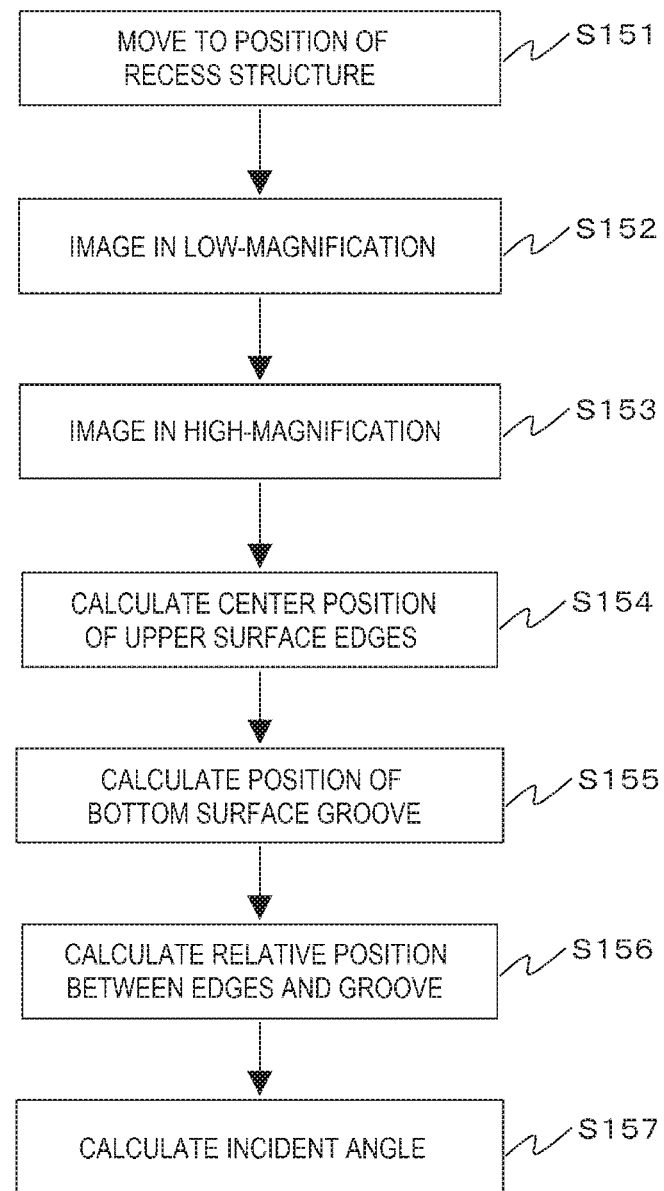

[FIG. 12]
(A) LOW-MAGNIFICATION IMAGE
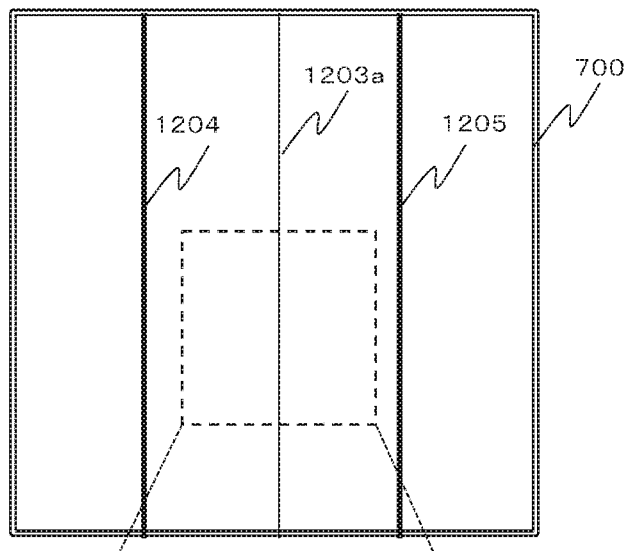
(B) HIGH-MAGNIFICATION IMAGE
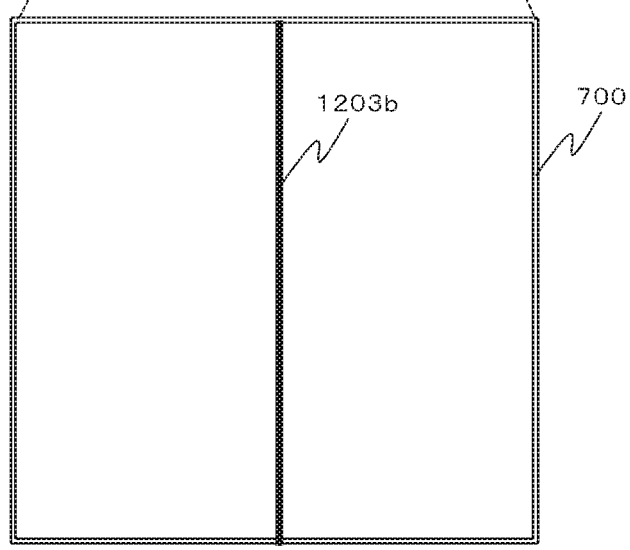

[FIG. 13]
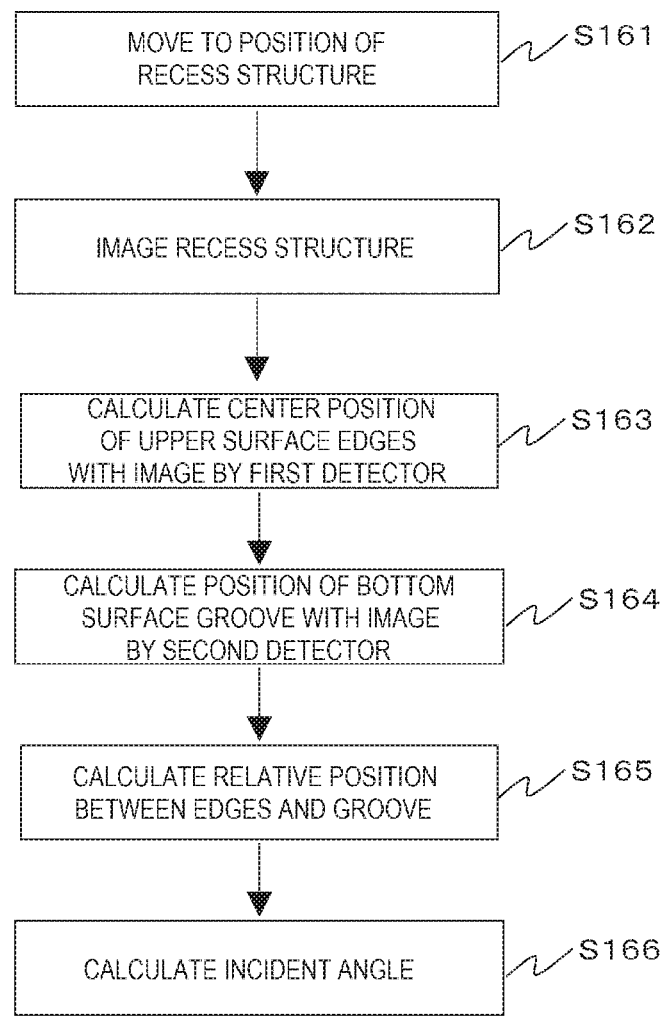

[FIG. 14A]
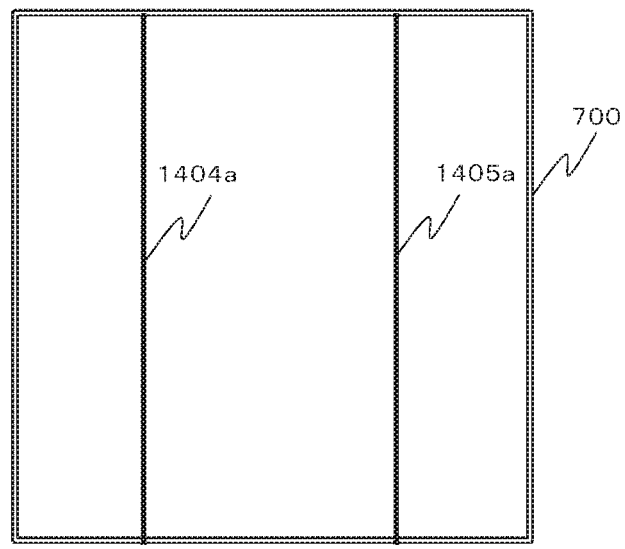
[FIG. 14B]
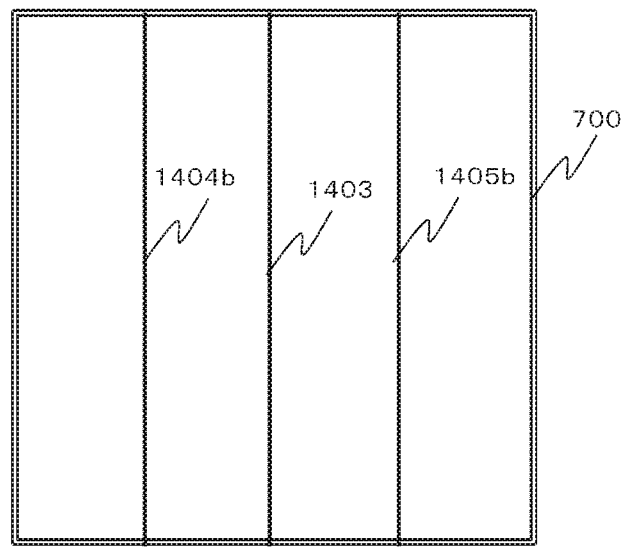

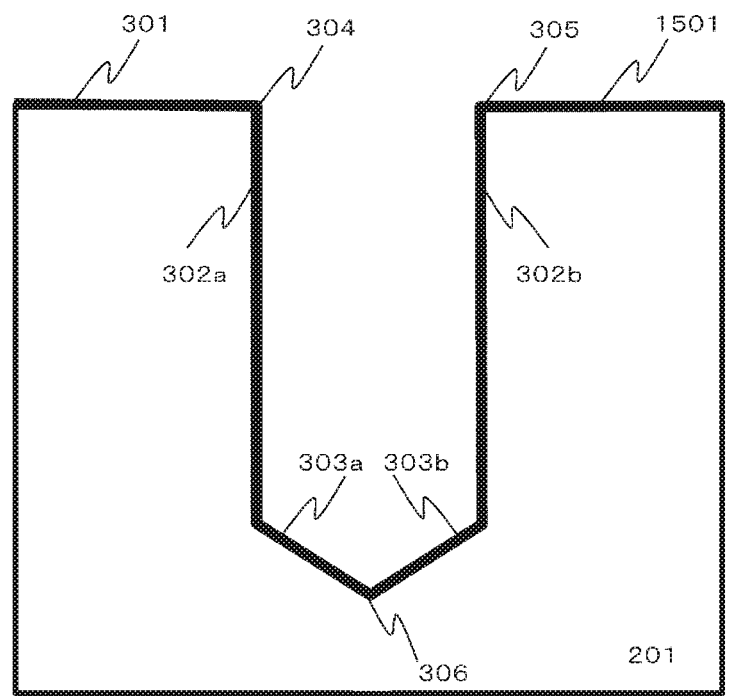
[FIG. 15]

[FIG. 16]
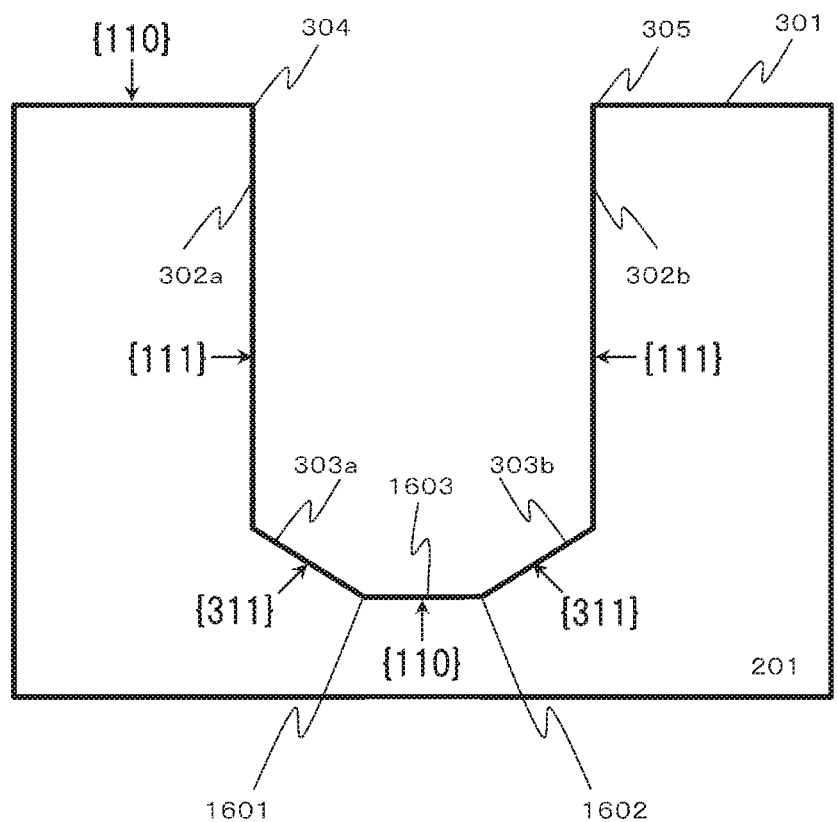

[FIG. 17]
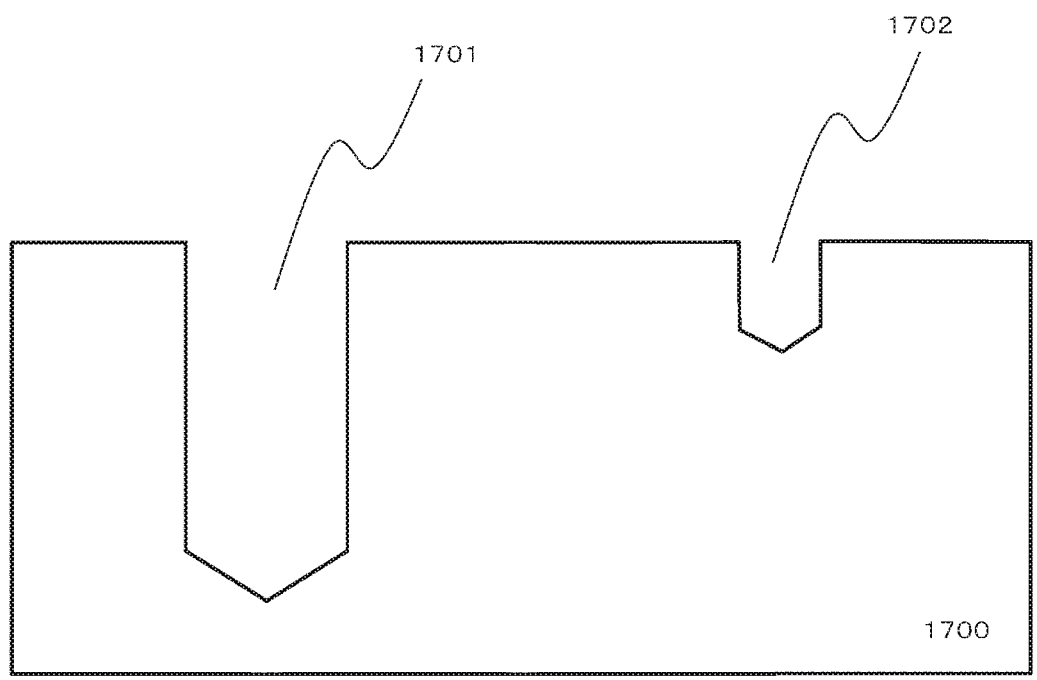

[FIG. 18]
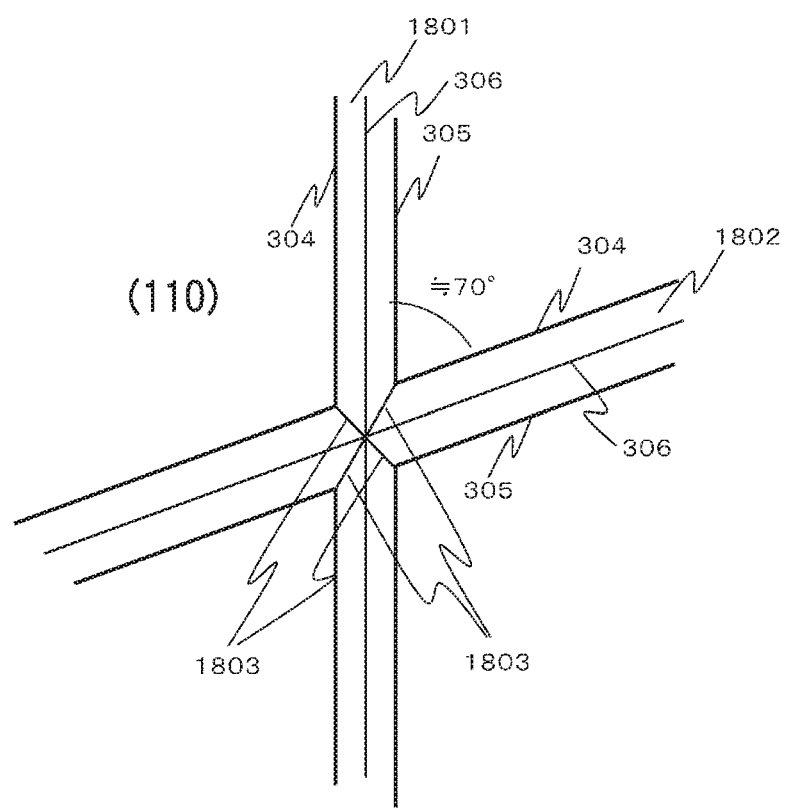

CALIBRATION SAMPLE, ELECTRON BEAM ADJUSTMENT METHOD AND ELECTRON BEAM APPARATUS USING SAME

TECHNICAL FIELD

The present invention relates to an electron beam apparatus that performs observation, inspection, and measurement using an electron beam, and more particularly to adjustment of an incident angle of the electron beam.

BACKGROUND ART

An electron beam apparatus such as a scanning electron microscope (SEM) used for observation, inspection, and measurement of a sample using an electron beam accelerates electrons emitted from an electron source, and concentrates the electrons onto a surface of the sample with an electrostatic lens or an electromagnetic lens to irradiate the surface of the sample. The electrons are called primary electrons. Secondary electrons are emitted from the sample due to incidence of the primary electrons. In the description, electrons emitted due to interaction between the sample and the primary electrons are broadly referred to as the secondary electrons, and are not distinguished by their generation mechanism or the like unless otherwise specified. That is, unless otherwise specified, the secondary electrons are described as secondary electrons in a broad sense including electrons such as reflected electrons and backscattered electrons. By deflecting and scanning with the electron beam (primary electrons) and detecting these emitted secondary electrons, a scanned image of a fine pattern and a composition distribution on the sample can be obtained. In addition, an absorption current image can be formed by detecting electrons absorbed by the sample.

In order to observe a bottom portion and to measure a pattern dimension with high accuracy with respect to a deep groove or a deep hole, it is necessary to make the electron beam incident perpendicularly to the deep groove or the deep hole. To implement this, it is necessary to measure an incident angle of the electron beam. Therefore, in PTL 1, a calibration sample is used in which a single crystal silicon having a (100) plane as an upper surface is subjected to crystal anisotropic etching to form a pyramidal shape (quadrangular pyramid) pattern. The incident angle of the electron beam is calculated by measuring positions of a plurality of edges of the pyramidal shape. In the crystal anisotropic etching of the single crystal silicon, an angle formed by side surfaces corresponding to crystal planes is determined, so that shape accuracy is high, and as a result, the incident angle can be measured with high accuracy.

CITATION LIST

Patent Literature

PTL 1: JP-A-2007-187538

Non-Patent Literature

Non-Patent Literature 1: Sensors and Actuators 73 (1999) 131-137

SUMMARY OF INVENTION

Technical Problem

In the pyramidal shape pattern, an aspect ratio of the shape (ratio of a depth to a width of the upper surface) is determined to be 1 or less. Therefore, it is difficult to increase a change in an image with respect to the incident angle, and the accuracy of the incident angle measurement is limited. According to the invention, a calibration sample by which an incident angle can be measured with high accuracy, an electron beam adjustment method and an electron beam apparatus using the calibration sample are implemented.

Solution to Problem

One aspect of the invention is a calibration sample for measurement of an incident angle of a primary electron emitted from an electron source of an electron beam apparatus, the calibration sample including: a silicon single crystal substrate whose upper surface is a {110} plane; a first recess structure opening in the upper surface and extending in a first direction; and a second recess structure opening in the upper surface and extending in a second direction intersecting the first direction, in which the first recess structure and the second recess structure each include a first side surface and a first bottom surface that intersects the first side surface, and a second side surface and a second bottom surface that intersects the second side surface, the first side surface and the second side surface are {111} planes, and the first bottom surface and the second bottom surface are crystal planes different from the {110} planes.

Another aspect of the invention is an electron beam adjustment method of adjusting an incident angle of a primary electron emitted from an electron source of an electron beam apparatus to a sample using a calibration sample, the calibration sample including a first recess structure that has an opening in an upper surface which is a {110} plane of a silicon single crystal substrate, extends in a first direction, and has a {111} plane as a side surface, and the first recess structure including a first upper surface edge and a second upper surface edge formed at the opening and extending in the first direction, and a first bottom surface groove formed at a bottom portion of the first recess structure and extending in the first direction. The electron beam adjustment method includes: imaging the first recess structure of the calibration sample; obtaining, in an image obtained by imaging the first recess structure, a first center position of upper surface edges that is a center position between the first upper surface edge and the second upper surface edge, and a position of the first bottom surface groove; and obtaining a first incident angle of the primary electron based on a relative position between the first center position of upper surface edges and the position of the first bottom surface groove, and a height difference between the first and second upper surface edges and the first bottom surface groove.

Other problems and novel characteristics will become apparent from a description of the description and the accompanying drawings.

Advantageous Effect

The incident angle of the primary electron necessary for observation, inspection, and measurement of a deep groove and a deep hole can be adjusted with high accuracy.

BRIEF DESCRIPTION OF DRAWINGS

FIG. 1 is an overall schematic view of a scanning electron microscope.

FIG. 2 is a bird's-eye view of a calibration sample for measurement of an incident angle of an electron beam.

FIG. 3 is a cross-sectional view of a recess structure formed in a calibration sample.

FIG. 4 is a flowchart of incident angle measurement.

FIG. 5 is a diagram showing a principle of the incident angle measurement.

FIG. 6 is a top view of a calibration sample having recess structures in a plurality of directions.

FIG. 7A is a schematic diagram of an image of a 0°-direction structure.

FIG. 7B is a schematic diagram of an image of an oblique-direction structure.

FIG. 8 is a flowchart for measuring an incident angle using the recess structures in the plurality of directions.

FIG. 9 is a flowchart of incident angle measurement.

FIG. 10A is a schematic diagram of an image when focused on an upper surface edge.

FIG. 10B is a schematic diagram of an image when focused on a bottom surface groove.

FIG. 11 is a flowchart of incident angle measurement.

FIG. 12 is a schematic diagram of two images imaged at different magnifications.

FIG. 13 is a flowchart of incident angle measurement.

FIG. 14A is a schematic diagram of an image from a first detector.

FIG. 14B is a schematic diagram of an image from a second detector.

FIG. 15 is a cross-sectional view of a recess structure formed in a calibration sample.

FIG. 16 is a cross-sectional view of a recess structure formed in a calibration sample.

FIG. 17 is a cross-sectional view of recess structures formed in a calibration sample.

FIG. 18 is a top view of recess structures formed in a calibration sample.

DESCRIPTION OF EMBODIMENTS

Embodiments of the invention will be described below with reference to the drawings. Here, a scanning electron microscope will be described as an example, but the invention can also be applied to an electron beam apparatus other than the scanning electron microscope.

FIG. 1 is an overall schematic view of the scanning electron microscope. An electron gun 101 includes an electron source 100 and an electrode for extracting electrons from the electron source. An electron beam (primary electrons 116) emitted from the electron gun 101 is concentrated, by a first condenser lens 103, a second condenser lens 105, and an objective lens 113, onto a sample 114 held on a stage 115 to irradiate the sample 114. In the objective lens shown in the drawing, since an electrostatic lens is formed by applying a positive voltage from a booster voltage control unit 141 to a magnetic path 110 on the objective lens and applying a negative voltage from a sample voltage control unit 144 to the sample 114, the objective lens 113 is a magnetic field-electric field superimposing lens. In addition, an opening of the objective lens 113 in FIG. 1 faces a sample side, and has a lens structure called a semi-in lens type. An excitation current flowing through an objective lens coil 112 is controlled by an objective lens control unit 142.

Secondary electrons 117 emitted from the sample 114 are detected by a first detector 121 in a middle part of a lens barrel or a second detector 122 on a bottom surface of an objective lens. The first detector 121 is controlled by a first detection system control unit 136, and the second detector 122 is controlled by a second detection system control unit 138.

In order to scan a desired observation position on the sample with the electron beam (primary electrons 116), a first scanning deflector 106 and a second scanning deflector 108 are provided. By scanning with the electron beam two-dimensionally with the first scanning deflector 106 and the second scanning deflector 108, a two-dimensional image of a surface of the sample 114 can be obtained. Two-dimensional scanning is generally performed while moving from a start position to perform line scanning in a horizontal direction (X direction) and line scanning in a vertical direction (Y direction). A center position of the two-dimensional image is defined by the first scanning deflector 106 controlled by a first scanning deflector control unit 137 and the second scanning deflector 108 controlled by a second scanning deflector control unit 139. For example, a path 116a of the electron beam 116 indicated by a solid line indicates a path that goes straight from the electron gun 101 toward the stage 115 without operation of the first scanning deflector 106 and the second scanning deflector 108. In this case, a two-dimensional image centered at a point 114a on the sample is formed. On the other hand, for a path 116b of the electron beam 116 indicated by a broken line, the first scanning deflector 106 and the second scanning deflector 108 exert forces on the primary electrons in opposite directions, and therefore, a position different from that of the path 116a on the sample 114 is irradiated with an electron beam (image shift). In this example, a two-dimensional image centered at a point 114b on the sample is formed. An electrostatic deflector may be used as the first scanning deflector 106 and the second scanning deflector 108. Secondary electrons generated by scanning with the electron beam are detected by the first detector 121 and/or the second detector 122, and imaged by a control arithmetic device 146, and the generated two-dimensional image is displayed on a display device 147. It is also possible to implement the deflector that determines the center position of the two-dimensional image and the deflector used in two-dimensionally scanning with the electron beam as separate deflectors.

The electron gun 101 is controlled by an electron gun control unit 131, the first condenser lens 103 is controlled by a first condenser lens control unit 133, and the second condenser lens 105 is controlled by a second condenser lens control unit 135. A first aligner 102 configured to control a beam axis of the primary electron 116 is disposed at a latter state of the electron gun 101, and is controlled by a first aligner control unit 132. In addition, the control arithmetic device 146 that controls the entire apparatus controls respective control units in a unified manner based on control data and the like stored in a recording device 145. In addition, detected signals detected by the first detector 121 and the second detector 122 are stored in the recording device 145 or displayed on the display device 147 for use. In addition, an incident angle calculation unit 148 calculates the incident angle based on imaging control for incident angle measurement and an acquired image. When observation, inspection, and measurement of the sample is performed, the control arithmetic device 146 controls, based on the calculated incident angle, a deflection direction and a deflection amount by the first scanning deflector 106 and the second scanning deflector 108 so that the electron beam (primary electrons 116) is incident perpendicularly to the sample. The control arithmetic device 146 can be implemented by a general computer, and the incident angle calculation unit 148 can be implemented as a program executed by a processor of the control arithmetic device 146.

A bird's-eye view of a calibration sample 200 for measurement of the incident angle of the electron beam (primary electrons 116) is shown in FIG. 2. In the calibration sample 200, a silicon single crystal substrate 201 has a recess structure A202 and a recess structure B203 opened on an upper surface of the silicon single crystal substrate 201. It is well known that an etching rate varies depending on a crystal plane of silicon, but it is possible to form a recess structure in a silicon single crystal substrate by performing crystal anisotropic etching using a potassium hydroxide (KOH) aqueous solution or the like using the difference in the etching rate (Non-Patent Literature 1). The upper surface of the single crystal substrate 201 is a (110) plane. In the recess structure A202, side surfaces are a (1−11) plane and a (−11−1) plane, and bottom surfaces are a (311) plane and a (13−1) plane. In the recess structure B203, side surfaces are a (1−1−1) plane and a (−111) plane, and bottom surfaces are a (31−1) plane and a (131) plane.

A cross-sectional view of the recess structure is shown in FIG. 3. The recess structure has an upper surface 301, a bottom surface 303a that intersects a side surface 302a, and a bottom surface 303b that intersects a side surface 302b. Since the bottom surface 303 is not a (110) plane but different crystal planes, a bottom surface groove 306 is formed at an intersection line of the bottom surface 303a and the bottom surface 303b. In the present embodiment, there are two edges formed in an opening of the recess structure, that is, an upper surface edge A304 that is an intersection line of the upper surface 301 and the side surface 302a, and an upper surface edge B305 that is an intersection line of the upper surface 301 and the side surface 302b, and the incident angle of the electron beam is obtained using an image of the bottom surface groove 306 parallel to the upper surface edge A304 and the upper surface edge B305. In FIG. 3, the crystal plane is shown as a general term. For example, the (1−11) plane and (−11−1) plane, which are the crystal planes on the side surfaces of the recess structure A202, are equivalent planes with different orientations (crystal planes with the same arrangement of atoms in the crystal plane), and these are comprehensively represented as a {111} plane. As shown in FIG. 3, an upper surface of the recess structure can be expressed as a {110} plane, a side surface as the {111} plane, and a bottom surface as a {311} plane. A shape of the recess structure depends on the etching rate in the crystal plane. For the etching rate at which the silicon single crystal is etched, by setting an etching condition as follows, an etching rate of the upper surface {110} plane>an etching rate of the bottom surface {311} plane>>an etching rate of the side surface {111} plane, a calibration sample having the recess structure shown in FIG. 2 can be created.

FIG. 4 is a flowchart for measuring the incident angle of the electron beam. FIG. 5 is a diagram showing a principle of the incident angle measurement. First, the sample or electron beam is moved to a position of the recess structure (step S41). Next, lens intensities are adjusted so that focuses of the electron beam are formed at the upper surface edge and the bottom surface groove, respectively. A height difference $\Delta H$ between the upper surface edge and the bottom surface groove can be obtained from the two lens intensities (step S42). Next, imaging is performed with a focus set at an intermediate height (step S43). This is because both structures cannot be fully focused at the same time due to the height difference $\Delta H$ between the upper surface edge and the bottom surface groove, so that they are focused on a position where both structures appear as clear as possible on a display 700. Then, a center position (center position 502 of upper surface edges) between an upper surface edge A504 and an upper surface edge B505 and a position 503 of bottom surface groove on an image of the display 700 are obtained (steps S44 and S45). Further, a relative position (difference $\Delta L$) between the center position 502 of upper surface edges and the position 503 of bottom surface groove is obtained (step S46).

As shown in FIG. 5, when the electron beam is incident with an incident angle $\alpha$, as a structure of the calibration sample, the bottom surface groove 306 at a center position between the upper surface edge A304 and the upper surface edge B305 appears to be shifted from the center position 502 between the upper surface edge A504 and the upper surface edge B505 on the image of the display 700. At this time, the incident angle $\alpha$ is calculated by $\alpha = \arctan(\Delta L/\Delta H)$ $\Delta L/\Delta H$ (step S47).

In the structure of the calibration sample 200 of FIG. 2, when the etching time is lengthened, $\Delta H$ can be increased, so that the difference $\Delta L$ is increased even with the same incident angle $\alpha$. Therefore, sensitivity of the incident angle measurement and accordingly the measurement accuracy is improved. This is an advantage of the calibration sample 200 having the side surfaces perpendicular to the upper surface. In a related pyramidal structure, in order to increase an amount corresponding to $\Delta H$, it is necessary to increase the entire size.

Further, the calibration sample 200 is formed with the recess structure A202 and the recess structure B203 whose directions are different from each other by substantially 70°. By measuring the incident angles from two directions, the incident angle can be calculated no matter how the electron beam is tilted with respect to the surface of the sample. Since the recess structure of the calibration sample 200 is formed by the crystal anisotropic etching that depends on a crystal plane orientation, an angle $\theta$ formed by the grooves of the two recess structures A202 and B203 is $\theta = \arccos(1/3) \approx 70.53°$ or $\theta = 180° - \arccos(1/3) \approx 109.47°$.

FIG. 6 is a top view of a calibration sample 600 having a plurality of recess structures in a plurality of directions. In the example of FIG. 6, a 0°-direction recess structure 601 is formed such that a longitudinal direction thereof extends in a Y-axis direction, and an oblique-direction recess structure 602 having a different extension direction from the 0°-direction recess structure 601 is disposed adjacently. An oblique-direction recess structure 602a is formed at an angle of about 110° with respect to a 0°-direction recess structure 601b. Similarly, an oblique-direction recess structure 602c is formed at an angle of about 70° with respect to the 0°-direction recess structure 601b. As described above, since these structures are formed by the crystal anisotropic etching, angles formed by the 0°-direction recess structure 601 and the oblique-direction recess structure 602 match with each other with high accuracy regardless of the recess structure.

FIGS. 7A and 7B are schematic diagrams of images of the 0°-direction recess structure 601 and the oblique-direction recess structure 602 of the calibration sample 600, respectively. FIGS. 7A and 7B show images of recess structures when line scanning directions with electron beams are set to the same X direction. Therefore, upper surface edges 704 and 705 and a position 703 of bottom surface groove in FIG. 7B are rotated with respect to the upper surface edges 504 and 505 and the position 503 of bottom surface groove in FIG. 7A. With respect to this, it is also effective when the scanning direction is changed according to the extension direction when scanning the recess structure. In the scanning electron microscope, there is a case where accuracy of line feed in the vertical direction is inferior to accuracy of line scanning in the horizontal direction. Therefore, the accuracy of the incident angle measurement in each direction can be improved by making the line scanning direction match with a direction orthogonal to a longitudinal direction of the groove. Specifically, when the incident angle measurement is performed with respect to the oblique-direction recess structure 602, the line scanning direction is rotated by 70° as compared with the case of the 0°-direction recess structure 601, and an image is acquired with the line scanning direction being orthogonal to the extension direction of the recess structure. The image acquired in this case is shown as in FIG. 7A regardless of the direction of the recess structure.

FIG. 8 shows a flowchart for calculating an incident angle of an electron beam from the calibration sample having recess structures in two directions. Basically, the incident angles are obtained in the respective directions, and based on a result thereof, the incident angles in the two orthogonal directions are calculated by vector calculation. Steps S81 to S83 and steps S84 to S86 correspond to, with respect to the recess structures in the respective directions, steps S41 to S43 shown in FIG. 4. In step S87, steps S44 to S47 shown in FIG. 4 are executed with respect to the recess structures in two directions. Accordingly, when an incident angle measured with the 0°-direction recess structure 601 is αA°, an incident angle measured with the oblique-direction recess structure 602 is αB°, and the 0°-direction recess structure 601 and the oblique-direction recess structure 602 forms an angle of substantially 70°, incident angles αX° and αY° converted into an orthogonal coordinate system can be calculated by Formula (step S88).

$$\begin{pmatrix} \alpha X \\ \alpha Y \end{pmatrix} = \begin{pmatrix} 1 & 1/3 \\ 0 & (1-1/9)^{0.5} \end{pmatrix} \times \begin{pmatrix} \alpha A \\ \alpha B \end{pmatrix} \quad \text{Formula 1}$$

In the flowchart of FIG. 8, imaging is separately performed on recess structures in different directions, but by adjusting a magnification, the recess structures in two directions may be imaged by one imaging, and an incident angle may be calculated for each of the recess structures.

Based on the incident angle calculated in this way, the first scanning deflector 106 and the second scanning deflector 108 are controlled in conjunction, so that the primary electrons 116 are perpendicularly incident on the sample. The incident angle (tilt angle) of the electron beam can be controlled by an intensity ratio ΔG and a relative angle ΔR in a deflection direction of the two-stage deflectors. With respect to the incident angles αX° and αY° converted into the orthogonal coordinate system, an amount of intensity ratio ΔG and an amount of relative angle ΔR to be adjusted can be obtained using a conversion matrix obtained in advance (refer to Formula 2). The control arithmetic device 146 controls, based on the obtained amount of the intensity ratio ΔG and the obtained amount of the relative angle ΔR, the first scanning deflector control unit 137 and the second scanning deflector control unit 139 in conjunction.

$$\begin{pmatrix} \Delta G \\ \Delta R \end{pmatrix} = \begin{pmatrix} a & b \\ c & d \end{pmatrix} \times \begin{pmatrix} \alpha X \\ \alpha Y \end{pmatrix} \quad \text{Formula 2}$$

In the flowchart of the incident angle measurement shown in FIG. 4, an example is shown in which a focal position is set at an intermediate height of the recess structure for imaging, and a modification thereof will be described with reference to FIG. 9 and FIGS. 10A, 10B. In the present modification, a plurality of images having different focal positions (focuses) is used. FIG. 9 is a flowchart according to the present modification. FIG. 10A is a schematic diagram of an image when focused on an upper surface edge. FIG. 10B is a schematic diagram of an image when focused on a bottom surface groove. Since the recess structure of the present embodiment has a depth, when focusing on an upper surface edge 1004a (1005a), a bottom surface groove 1003a is blurred, and when focusing on a bottom surface groove 1003b, an upper surface edge 1004b (1005b) is blurred. Therefore, in the present modification, images having a plurality of focal positions are used. After moving to a position of the recess structure (step S91), imaging is performed on an upper surface and a bottom surface as focal positions (steps S92 and S93), a center position of upper surface edges is calculated from an image with the upper surface being focused (step S94), and a position of bottom surface groove is calculated from an image with the bottom surface being focused (step S95). Here, there is a possibility that a center position of the acquired images with different focuses shifts depending on a trajectory adjustment of the electron beam. Therefore, it is necessary to correct a relative position between the center position of upper surface edges and the position of bottom surface groove by examining a relationship between a shift amount and the focal positions of an image position in advance, or by performing position matching to maximize correlation of the acquired images (step S96). Finally, the incident angle is calculated based on the corrected relative position (step S97). Accordingly, measurement reproducibility can be improved. The recess structure of the present embodiment is advantageous because when a groove whose sample height continuously changes is used in a pyramidal pattern, it is difficult to perform measurement using images with a plurality of focal positions.

The number of images to be imaged by changing the focal position is not limited to two, and an image having a focal position between the upper surface and the bottom surface may be additionally acquired. Since the image shift amount has a linear relationship with the focal position, it is useful for correcting the relative position.

Still another modification of the flowchart of the incident angle measurement shown in FIG. 4 will be described with reference to FIGS. 11 and 12. In the present modification, a plurality of images acquired at different magnifications is used. Since the recess structure of the present embodiment has a depth, a signal amount from the bottom surface is small compared with that of the upper surface. Therefore, measurement performance of the position of bottom surface groove tends to deteriorate. Therefore, in the present modification, a high-magnification image of the bottom surface groove is acquired. After moving to a position of the recess structure (step S151), a low-magnification image including the upper surface edges shown in FIG. 12A is acquired (step S152), and then a high-magnification image not including the upper surface edges shown in FIG. 12B is acquired (step S153). A center of upper surface edges and a position of bottom surface groove are calculated from each image (steps S154 and S155), and finally an incident angle is calculated (steps S156 and S157). Since a pixel size is small in the high-magnification image, the measurement accuracy can be improved from the viewpoint of resolution and SN.

Still another modification of the flowchart of the incident angle measurement shown in FIG. 4 will be described with reference to FIG. 13 and FIGS. 14A and 14B. In the present modification, a plurality of images with different emission angle regions or energy region signals is used. Since the recess structure of the present embodiment has a depth, energy and angular distribution of secondary electrons which are emitted from the upper surface edges of the sample and from the bottom surface groove of the sample are different. By forming images using high-contrast electrons on each of the upper surface and the bottom surface, SN is improved and measurement accuracy is improved. As shown in the flowchart of FIG. 13, after moving to a position of the recess structure (step S161), the recess structure is imaged (step S162), and it is effective to detect the upper surface edge with an image by the first detector (step S163), and detect the bottom surface groove with an image by the second detector (step S164).

By irradiating the sample with the primary electrons, electrons having different energies are emitted. In the scanning electron microscope shown in FIG. 1, the secondary electrons (here, the secondary electrons refer to secondary electrons in the narrow sense, and are defined as electrons in the sample which are excited and emitted by inelastic scattering of the electrons incident on the sample, whose energy is generally 50 eV or less) are accelerated by a booster voltage applied to the magnetic path 110 on the objective lens, and thus are mainly detected by the first detector 121. In addition, reflected electrons having relatively high energy (or backscattered electrons which are re-emitted from the surface of the sample in a process of scattering the electrons incident on the sample in the sample) are mainly detected by the second detector 122. Since an amount of emission of secondary electrons (narrowly defined) is highly angularly dependent, an edge of the sample is likely to appear, while reflected electrons and backscattered electrons are highly scattered, and the edge of the sample is likely to be blurred. On the other hand, the secondary electrons (narrowly defined) have low energy, so that the amount of emission from a bottom surface of a deep groove is low, and reflected electrons and backscattered electrons have high energy, so that reflected electrons and backscattered electrons from the bottom surface of the deep groove are also detected by the second detector 122.

Therefore, in an image from the first detector shown in FIG. 14A, upper surface edge images (1404a and 1405a) are observed, but the bottom surface groove is not observed. On the other hand, in an image from the second detector shown in FIG. 14B, a bottom surface groove (1403) is emphasized and observed. A center position of upper surface edges and a position of bottom surface groove are calculated from respective images (steps S163 and S164), and finally the incident angle is calculated (steps S165 and S166).

In addition, modifications of the calibration sample for the incident angle measurement will be described below. In the calibration sample of a first modification, a calibration sample having a recess structure shown in a cross-sectional view of FIG. 15 is used. This calibration sample is obtained by stacking a thin film 1501 of $HfO_2$ (hafnium oxide) on a silicon substrate structure by an atomic layer deposition (ALD) film forming method. Since the ALD film forming method enables stack of a uniform film thickness while maintaining a recess structure shape, it is particularly effective as a film forming method on the recess structure of the calibration sample of the present embodiment. By forming a surface film containing a heavy element on the recess structure, it is possible to improve generation efficiency of the secondary electrons from the recess structure, so that the measurement accuracy is improved due to SN improvement. A material to be stacked is preferably a material having a large atomic number, such as $Ta_2O_5$ or $La_2O_3$.

In a second modification of the calibration sample, a calibration sample having a recess structure shown in a cross-sectional view of FIG. 16 is used. The recess structure of the calibration sample has a bottom surface 1603 parallel to the upper surface 301 in addition to the bottom surface 303 inclined with respect to the upper surface 301. That is, the bottom surface 303 is the {311} plane, while the bottom surface 1603 is the {110} plane same as the upper surface. Accordingly, a bottom surface groove 1601 is formed at an intersection line of the bottom surface 303a and the bottom surface 1603, and a bottom surface groove 1602 is formed at an intersection line of the bottom surface 303b and the bottom surface 1603. This can be implemented by changing the etching condition of the silicon substrate 201. In the present modification, the tilt angle is calculated using the two upper surface edges 304 and 305 and the two bottom surface grooves 1601 and 1602. Specifically, the incident angle is calculated using a relative distance between a center position of two upper surface edge positions and a center position of two positions of bottom surface grooves (this relative distance is represented by ΔL in FIG. 5). In this calibration sample structure, the number of bottom grooves is two, so that the signal amount increases and the measurement accuracy can be improved.

In a third modification of the calibration sample, a calibration sample having two types of recess structures shown in a cross-sectional view of FIG. 17 is used. Specifically, a recess structure D1702 shallower than a recess structure C1701 is provided. For example, the recess structure C1701 has the same depth as the recess structure A202, and the recess structure D1702 has a shallower structure. In the scanning electron microscope, an acceleration amount of primary electrons can be adjusted, and the primary electrons can be incident on the sample in a high acceleration mode (for example, 45 kV) or a low acceleration mode (for example, 1 kV). In the low acceleration mode, damage to an observation sample can be reduced as compared with the high acceleration mode. However, in the case of 1 kV electrons of low acceleration, the secondary electrons cannot break away from a deep part of the sample, and therefore, an amount of secondary electrons detected from a deep groove decreases. According to the present modification, the depth of the recess structure can be selectively used from a viewpoint of signal detection. Therefore, in the calibration sample of FIG. 17, the recess structure D1702 for the low acceleration mode and the recess structure C1701 for the high acceleration mode are formed on a silicon substrate 1700 together. Recess structures with different depths can be formed by controlling time of the crystal anisotropic etching. Therefore, the depth of each recess structure may be measured based on the focal position of the electron beam as described in the flowchart of FIG. 4, but a relationship between the etching time and the depth may be obtained in advance, and the depth is estimated based on the etching time. Since this calibration sample has recess structures with different depths, the incident angle can be measured regardless of the acceleration amount of the electron beam. In FIG. 17, only two types of recess structures having the same extending direction are shown, but recess structures having different extension directions may be provided correspondingly. That is, a recess structure having the same depth as the recess structure C1701 and intersecting an extension direction thereof at about 70° (or about 110°) can be provided. Similarly, a recess structure having the same depth as the recess structure D1702 and intersecting an extension direction thereof at about 70° (or about 110°) can be provided.

In a fourth modification of the calibration sample, a calibration sample in which two recess structures shown in a top view of FIG. 18 intersect is used. A pattern in FIG. 18 is obtained by intersecting two-direction lines of the 0°-direction recess structure and the oblique-direction recess structure shown in FIG. 16. Therefore, measurement in two directions in the same visual field becomes easy. In addition, since a peak 1803 in a direction that does not exist in FIG. 6 is formed at an intersection point of the two lines, this peak 1803 may be used for the incident angle measurement.

The invention is not limited to the above embodiments, and includes various modifications. For example, in the calibration sample of the present embodiment, the recess structure having the upper surface of the {110} plane, the side surface of the {111} plane, and the bottom surface of the {311} plane is disclosed, but other crystal planes can be taken as the bottom surface as long as the relationship for the etching rate is satisfied as described above. There is also a possibility that the crystal plane has at least one absolute value of an index of 2 or more, for example, a {211} plane. Also, the embodiments are illustrative of the invention and are not necessarily limited to those having all the configurations described. In addition, a part of the embodiment can be replaced with another configuration, deleted, or added. In addition, although a plurality of modifications is described, it is also possible to use a combination of configurations of a plurality of modifications.

REFERENCE SIGN LIST

100: electron source
101: electron gun
102: first aligner
103: first condenser lens
105: second condenser lens
106: first scanning deflector
108: second scanning deflector
113: objective lens
114: sample
115: stage
116: primary electron
117: secondary electron
121: first detector
122: second detector
131: electron gun control unit
132: first aligner control unit
133: first condenser lens control unit
135: second condenser lens control unit
136: first detection system control unit
137: first scanning deflector control unit
138: second detection system control unit
139: second scanning deflector control unit
141: booster voltage control unit
142: objective lens control unit
144: sample voltage control unit
145: recording device
146: control arithmetic device
147: display device
148: incident angle calculation unit
200: calibration sample
201: silicon substrate
202: recess structure A
203: recess structure B
301: upper surface
302: side surface
303: bottom surface
304: upper surface edge A
305: upper surface edge B
306: bottom surface groove
501: electron beam
502: center position of upper surface edges
503: position of bottom surface groove
601: 0°-direction recess structure
602: oblique-direction recess structure
1501: $HfO_2$ thin film
1700: silicon substrate
1701: recess structure C
1702: recess structure D

The invention claimed is:

1. A calibration sample for measurement of an incident angle of a primary electron emitted from an electron source of an electron beam apparatus, the calibration sample comprising:
a silicon single crystal substrate whose upper surface is a {110} plane;
a first recess structure opening in the upper surface and extending in a first direction; and
a second recess structure opening in the upper surface and extending in a second direction intersecting the first direction, wherein
the first recess structure and the second recess structure each include a first side surface and a first bottom surface that intersects the first side surface, and a second side surface and a second bottom surface that intersects the second side surface,
the first side surface and the second side surface are {111} planes, and
the first bottom surface and the second bottom surface are crystal planes different from the {110} planes.

2. The calibration sample according to claim 1, wherein the first bottom surface and the second bottom surface are {311} planes.

3. The calibration sample according to claim 2, wherein a bottom surface groove is formed at an intersection line of the first bottom surface and the second bottom surface.

4. The calibration sample according to claim 2, wherein the first recess structure and the second recess structure further include a third bottom surface that is a {110} plane, a first bottom surface groove is formed by an intersection line of the first bottom surface and the third bottom surface, and a second bottom surface groove is formed by an intersection line of the second bottom surface and the third bottom surface.

5. The calibration sample according to claim 1, wherein a surface film is formed on the upper surface, the first recess structure, and the second recess structure, and the surface film includes at least one of $HfO_2$, $Ta_2O_5$, and $La_2O_3$.

6. The calibration sample according to claim 1, further comprising:
a third recess structure opening in the upper surface and extending in the first direction; and
a fourth recess structure opening in the upper surface and extending in the second direction, wherein
the third recess structure and the fourth recess structure each include the first side surface, the first bottom surface, the second side surface, and the second bottom surface, and the first recess structure and the second recess structure have a first depth, and the third recess structure and the fourth recess structure have a second depth shallower than the first depth.

7. The calibration sample according to claim 1, wherein the first recess structure intersects the second recess structure.

8. An electron beam adjustment method of adjusting an incident angle of a primary electron emitted from an electron source of an electron beam apparatus to a sample using a calibration sample,
the calibration sample including a first recess structure that has an opening in an upper surface which is a {110} plane of a silicon single crystal substrate, extends in a first direction, and has a {111} plane as a side surface, and the first recess structure including a first upper surface edge and a second upper surface edge formed at the opening and extending in the first direction, and a first bottom surface groove formed at a bottom portion of the first recess structure and extending in the first direction,
the electron beam adjustment method comprising:
imaging the first recess structure of the calibration sample;
obtaining, in an image obtained by imaging the first recess structure, a first center position of upper surface edges that is a center position between the first upper surface edge and the second upper surface edge, and a position of the first bottom surface groove; and
obtaining a first incident angle of the primary electron based on a relative position between the first center position of upper surface edges and the position of the first bottom surface groove, and a height difference between the first and second upper surface edges and the first bottom surface groove.

9. The electron beam adjustment method according to claim 8, wherein
the calibration sample including a second recess structure that has an opening in the upper surface of the silicon single crystal substrate, extends in a second direction intersecting the first direction, and has the {111} plane as a side surface, and the second recess structure including a third upper surface edge and a fourth upper surface edge formed at the opening and extending in the second direction, and a second bottom surface groove formed at a bottom portion of the second recess structure and extending in the second direction,
the electron beam adjustment method further comprising:
imaging the second recess structure of the calibration sample;
obtaining, in an image obtained by imaging the second recess structure, a second center position of upper surface edges that is a center position between the third upper surface edge and the fourth upper surface edge, and a position of the second bottom surface groove;
obtaining a second incident angle of the primary electron based on a relative position between the second center position of upper surface edges and the position of the second bottom surface groove, and a height difference between the third and fourth upper surface edges and the second bottom surface groove; and
calculating incident angles in two orthogonal directions based on the first incident angle and the second incident angle.

10. The electron beam adjustment method according to claim 9, wherein
the electron beam apparatus including a first deflector and a second deflector which are configured to deflect the primary electron,
the electron beam adjustment method further comprising:
obtaining, based on the incident angles in two orthogonal directions, an intensity ratio and a relative angle of the first deflector and the second deflector; and
adjusting, based on the obtained intensity ratio and the relative angle, the incident angle of the primary electron to the sample by controlling the first deflector and the second deflector.

11. The electron beam adjustment method according to claim 10, further comprising:
imaging the first recess structure of the calibration sample with a line scanning direction orthogonal to the first direction; and
imaging the second recess structure of the calibration sample with the line scanning direction orthogonal to the second direction.

12. The electron beam adjustment method according to claim 10, further comprising:
imaging, when the first recess structure and the second recess structure of the calibration sample are imaged, an upper focus image having a focal position at the upper surface edge and a bottom focus image having a focal position at the bottom surface groove;
obtaining a center position of the upper surface edges from the upper focus image;
obtaining a position of the bottom surface groove from the bottom focus image; and
obtaining the incident angle of the primary electron based on a relative position between the center position of the upper surface edges and the position of the bottom surface groove after a shift amount of an image position due to the focal position is corrected, and a height difference between the upper surface edges and the bottom surface groove.

13. The electron beam adjustment method according to claim 10, wherein
the calibration sample having recess structures with different depths,
the electron beam adjustment method further comprising:
selectively using a recess structure to be used for adjustment of the electron beam according to an acceleration amount of the primary electron.

14. An electron beam apparatus comprising:
an electron source emitting a primary electron;
a stage on which a sample is placed;
a plurality of lenses for concentrating the primary electron onto the sample;
a first deflector and a second deflector configured to control a scanning position of the primary electron;
a first deflector control unit configured to control the first deflector;
a second deflector control unit configured to control the second deflector;
a detector configured to detect a secondary electron generated by irradiating the sample with the primary electron; and
a control arithmetic device including an incident angle calculation unit configured to calculate an incident angle at which the sample is irradiated with the primary electron, wherein
the control arithmetic device performs imaging by detecting, by the detector, the secondary electron generated by two-dimensionally scanning a calibration sample placed on the stage with the primary electron, the incident angle calculation unit obtains an incident angle at which the calibration sample is irradiated with the primary electron from recess structures in two directions of the calibration sample in an image of the calibration sample, and converts the incident angle into an incident angle in an orthogonal coordinate system, and the recess structures in two directions of the calibration sample are a first recess structure and a second recess structure each have an opening on an upper surface which is a {110} plane of a silicon single crystal substrate, the first recess structure extending in a first direction and having a {111} plane as a side surface, and the second recess structure extending in a second direction intersecting the first direction and having the {111} plane as a side surface.

15. The electron beam apparatus according to claim 14, wherein the control arithmetic device obtains an intensity ratio and a relative angle of the first deflector and the second deflector based on the incident angle in the orthogonal coordinate system, and controls, based on the intensity ratio and the relative angle, the first deflector control unit and the second deflector control unit in conjunction.

* * * * *